United States Patent
Quioc

(10) Patent No.: US 6,851,373 B2
(45) Date of Patent: Feb. 8, 2005

(54) AIRBELT INFLATOR

(75) Inventor: Eduardo L. Quioc, Westland, MI (US)

(73) Assignee: Automotive Systems Laboratory, Inc., Farmington Hills, MI (US)

( * ) Notice: Subject to any disclaimer, the term of this patent is extended or adjusted under 35 U.S.C. 154(b) by 0 days.

(21) Appl. No.: 10/372,996

(22) Filed: Feb. 24, 2003

(65) Prior Publication Data

US 2003/0159613 A1 Aug. 28, 2003

Related U.S. Application Data

(60) Provisional application No. 60/358,790, filed on Feb. 22, 2002.

(51) Int. Cl.[7] .............................. B60R 21/26; C06D 5/00
(52) U.S. Cl. ......................... 102/530; 102/531; 280/741
(58) Field of Search ................................ 102/530, 531; 280/733, 736, 740, 741, 742

(56) References Cited

U.S. PATENT DOCUMENTS

| | | | | |
|---|---|---|---|---|
| 3,898,048 A | * | 8/1975 | Barber et al. ................ | 102/530 |
| 4,899,663 A | * | 2/1990 | Thorn .......................... | 102/530 |
| 5,615,912 A | * | 4/1997 | O'Loughlen et al. ....... | 102/531 |
| 5,727,813 A | * | 3/1998 | Stratton et al. ............. | 280/742 |
| 6,116,137 A | | 9/2000 | Strahan ........................ | 89/196 |
| 6,120,058 A | * | 9/2000 | Mangum et al. ............ | 280/741 |
| 6,142,512 A | | 11/2000 | Suyama ....................... | 280/733 |
| 6,145,873 A | | 11/2000 | Takeuchi ..................... | 280/733 |
| 6,170,863 B1 | | 1/2001 | Takeuchi et al. ............ | 280/733 |
| 6,206,418 B1 | * | 3/2001 | Perotto et al. .............. | 102/530 |
| 6,439,601 B1 | | 8/2002 | Iseki ........................... | 280/733 |
| 6,662,702 B1 | * | 12/2003 | Vidot et al. .................. | 89/1.14 |
| 6,662,727 B2 | * | 12/2003 | Bornheim et al. .......... | 102/530 |
| 6,676,157 B2 | * | 1/2004 | Nanbu ......................... | 280/736 |
| 6,718,884 B1 | * | 4/2004 | Yabuta et al. ............... | 102/530 |
| 2004/0021306 A1 | * | 2/2004 | Leil ............................ | 280/736 |

* cited by examiner

Primary Examiner—Michael J. Carone
Assistant Examiner—James S. Bergin
(74) Attorney, Agent, or Firm—L. C. Begin & Associates, PLLC

(57) ABSTRACT

An airbelt inflator (10) is provided for supplying and directing gas from the combustion of pyrotechnic materials into an inflatable safety belt or airbag. The airbelt inflator (10) includes a substantially cylindrical body (12). One or more ledges (26, 42) are defined by the junctions of inner walls (34, 36, and 38) wherein each ledge (26, 42) functions to retain an inner inflator component. In another aspect of the invention, an enhancer disc (56) features a metallic density greater than an associated filter (48) whereby tailoring of the density of the metallic disc (56) facilitates a quick and easy method of modifying the gas flow exiting the inflator (10).

4 Claims, 1 Drawing Sheet

AIRBELT INFLATOR

CROSS-REFERENCE TO RELATED APPLICATIONS

The present application claims the benefit of U.S. Provisional Application No. 60/358,790 filed on Feb. 22, 2002.

FIELD OF THE INVENTION

The present invention relates to vehicle occupant protection systems, and specifically to a gas generator or inflator that provides an adjustable gas output rate, and an enhanced thrust for airbelts or side impact airbags, for example, while minimizing the size of the inflator.

BACKGROUND

Ongoing improvements in vehicle occupant protection systems include the advent of sub systems such as a side impact airbag and an airbelt system. To facilitate such systems, a gas generator featuring an adjustable gas output rate, an enhanced thrust and a minimal size is desired. Although many of the state-of-the-art gas generators are useful in these contexts, improving the thrust, ready tailoring of the gas output, and minimizing the size of the inflator presents certain advantages over known inflators.

SUMMARY OF THE INVENTION

In a preferred embodiment, the above referenced concerns are resolved by an airbelt inflator (10) provided for supplying and directing gas from the combustion of pyrotechnic materials into an inflatable safety belt or airbag. The airbelt inflator (10) comprises a substantially cylindrical inflator body (12) having a first end (14) and a second end (16). An initiator assembly (18) is positioned in the inflator body (12) adjacent the first end (14), and rests upon an interior ledge (26). A filter assembly (48) is positioned in the inflator body (12) proximate the second end (16), and rests upon a second interior ledge (42), being separated from the initiator assembly (18) by a cavity containing gas generant tablets (32). An output enhancer (56) is placed in intimate association and in coaxial alignment with the filter assembly (48) and a gas output disk (52), the gas output disk itself being adjacent a nozzle adaptor (50) positioned at the second end (16). Crimping the second end (16) of the inflator body (12) secures the nozzle adaptor (50), gas output disk (52), the output enhancer (56), and the filter assembly (48). Assembly of the airbelt inflator (10) begins by inserting the pre-assembled initiator assembly (18) into the inflator body (12) until it rests upon the ledge (26), then crimping the end (14) of the inflator body (12) to hold the initiator (18) in place. Once the initiator (18) is secured, the inflator body (12) can be inverted, and the main propellant tablets (32), filter assembly (48), output enhancer (56), and the nozzle adaptor (50) can be loaded into the inflator (10). Output enhancers having different densities may be incorporated into the inflator body to reduce or increase the relative rate of gas output. Finally, the second end (16) of the inflator body (12) is crimped to secure the components, completing assembly.

DETAILED DESCRIPTION

Figure 1:
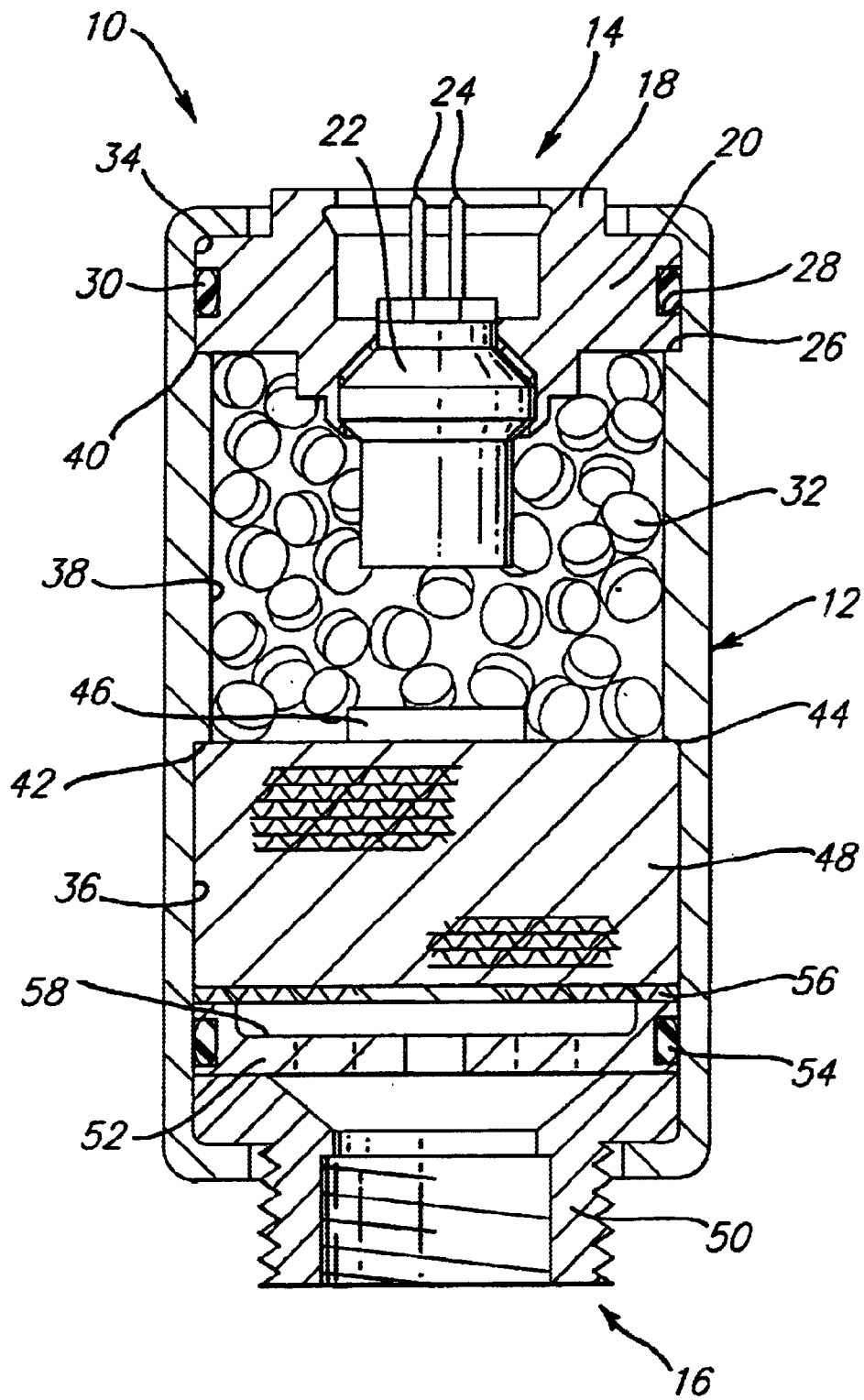
FIG. 1 is a cross-sectioned view of a gas generator in accordance with the present invention.

Referring to FIG. 1, there is shown an airbelt inflator 10 according to a preferred constructed embodiment of the present invention. Inflator 10 is preferably designed for supplying and directing gas from the combustion of pyrotechnic materials into an inflatable vehicle safety airbelt, but is not thereby limited in use. Exemplary, but not limiting airbelts are described in U.S. Pat. Nos. 6,439,601; 6,170,863; 6,145,873, and 6,142,512, the teachings of which are herein incorporated by reference.

Inflator 10 includes a substantially cylindrical inflator body or housing 12, preferably metallic, having a first end 14 and a second end 16. It is contemplated that ceramic, polymeric, and other suitable materials may be useful in manufacturing the various components of inflator 10. An initiator assembly 18 having a first outer diameter is positioned in inflator body 12 within first end 14, and preferably held in place by crimping first end 14 in a conventional manner. Initiator assembly 18 includes an initiator body 20 with an attached igniter 22. The igniter 22 or squib has a set of electrical contacts 24 preferably accessible from first end 14. Igniter 22 is preferably a conventional igniter such as that taught in U.S. Pat. Nos. 5,934,705 or 5,727,813, herein incorporated by reference, and is preferably connected to an automobile electrical system by which it may be activated in a conventional manner. In the preferred embodiment, body 20 rests upon a first interior ledge 26 of inflator body 12 and is held by a crimp at first end 14, although it should be appreciated that some other suitable affixing method such as threads or snap-fitting might be used without departing from the scope of the present invention. An elastomeric O-ring 28 is preferably positioned in an annulus 30 encircling initiator body 20 and creating a fluid-tight seal with inflator body 12.

In accordance with the present application, a first inner wall 34 is formed proximate the first end 14, and defines a first diameter about equal to the outer diameter of the initiator assembly. A second inner wall 36 is formed proximate the second end 16 and defines a second diameter. As shown in FIG. 1, the first and second diameters are essentially equal, although the present invention is not thereby limited. A third inner wall 38 is formed intermediate of the first and second inner walls 34 and 36, and forms a third diameter thereby containing a bed of propellant tablets 32. A first ledge 26 is formed at a point 40 where the first inner wall 34 and the third inner wall 38 meet. If desired, a second ledge 42 is formed at a point 44 where the second inner wall 36 and the third inner wall 38 meet. Each ledge represents an integral structural obstruction within the housing 12 that facilitates discrete placement or orientation of inflator components without the need for welding.

The plurality of tablets of a main propellant charge 32, are positioned within the interior of inflator body 12, and are ignitable by igniter 22 in a conventional manner. The charge or gas generant composition may be any suitable propellant known in the art, and is preferably a non-azide propellant. Exemplary, but not limiting, compositions are described in U.S. Pat. Nos. 5,872,329, 5,756,929, and 5,386,775, herein incorporated by reference. A second charge consisting of an autoignition material 46 is preferably positioned within inflator body 12 adjacent the main charge 32, and is ignitable in a conventional manner. A filter 48 is positioned within inflator body 12 adjacent the propellant charges 32 and 46. In a preferred embodiment, filter 48 is a well-known conventional metallic mesh filter, however, some other suitable type of filter might be used. The second ledge 42 preferably abuts filter 48, and assists in maintaining the various components of inflator 10 in their desired positions.

Turning to second end 16, a preferably metallic nozzle adaptor 50, is fixed therein and directs the flow of combustion gases out of inflator body 12 and into an inflatable airbelt or airbag (not shown). Nozzle adaptor 50 is also preferably held in place by crimping the second end 16 of inflator body 12, however, it might also be affixed with threads, adhesives, welds or some other suitable attachment method. A perforated gas output disk 52 is positioned adjacent nozzle adaptor 50, and preferably has a second elastomeric O-ring 54 around its circumference, creating a fluid-tight seal at second end 16.

In yet another aspect of the invention, an enhancer disc 56 is oriented intermediate of filter 48 and at end 16, and is juxtaposed against the filter 48 in coaxial alignment therewith. The metallic density of the enhancer disc 56 is tailored to accommodate the desired gas flow rate depending on design criteria. As such, the present inflator may be tailored to modify the gas flow rate from the inflator by altering the metallic density of the enhancer disc 56. Stated another way, the metallic density of disc 56 generally exceeds that of filter 48, wherein the metallic density of disc 56 may be modified to be slightly greater to much greater relative to the metallic density of filter 48. Known suppliers such as Wayne Wire Cloth of Hillman, Mich. or Expan Metal of Saginaw, Mich. may supply filter 48 and the enhancer disc 56. A burst shim 58 seals the enhancer disc 56 thereby facilitating a pressure increase within the inflator 10 for combustion of propellant 32.

Assembly of inflator 10 preferably begins by inserting the pre-assembled initiator assembly 18 into inflator body 12 until it rests upon ledge 26, then crimping the edges of the first end 14 toward the interior of inflator body 12 to secure initiator assembly 18 therein. Once initiator assembly 18 has been inserted, inflator body 12 is inverted, and the main propellant tablets 32 are loaded. Next, the autoignition material 46 is added, followed by the filter 48. The filter 48 is preferably biased against the second ledge 42 whereby the outer diameter 49 of the filter 48 is essentially equal to the second diameter defined by the inner wall 36. Assembly of inflator 10 is completed by serially loading the enhancer disk 56, burst shim 58, gas output disk 52, and finally nozzle adaptor 50. Nozzle adaptor 50 is preferably secured by crimping the edges of second end 16 about the adapter 50. The various components herein described as positioned in inflator body 12 are all preferably substantially discoidal.

In the event of an impact, sudden vehicle deceleration, or other desired condition, an electrical signal is sent to igniter 22 from an onboard electronic controller (not shown) in a conventional manner. Igniter 22 subsequently ignites the gas generant tablets 32 located within inflator body 12. If desired, a booster material (not shown) can be included in inflator 10 to facilitate ignition of the main charge 32. Ignition of tablets 32 results in the very rapid creation of combustion gases in inflator body 12, and a consequent very rapid rise in the internal gas pressure in inflator body 12. When the internal gas pressure has risen to a sufficient level, it ruptures burst shim 58. The combustion gas passes through filter 48, thereby removing slag, then through enhancer disk 56, gas output disk 52, and finally into an associated airbelt or airbag via nozzle adaptor 50.

Airbelt inflator 10 represents a relatively simple design, is light in weight, and uses relatively few components. The manufacturing of inflator 10 is thus relatively easy and inexpensive. In addition, inflator 10 is capable of meeting any required gas output without compromising its structural integrity. Inflator 10 is preferably positioned in a vehicle B-pillar, and operable to direct inflation gas into an inflatable safety restraint belt when activated by a conventional vehicle sensing system known in vehicle occupant protection systems. However, inflator 10 might also be positioned in a vehicle C-pillar, or even elsewhere in the vehicle. Furthermore, inflator 10 is not limited in application to vehicle airbelts, and could be applicable to conventional vehicle airbags as well. It should be understood that the present description is for illustrative purposes only and should not be construed to limit the breadth of the present invention in any way. Thus, those skilled in the art will appreciate that various modifications might be made to the presently disclosed embodiments without departing from the spirit and scope of the present invention, as indicated in the appended claims.

What is claimed is:

1. A pyrotechnic gas generator comprising:

a housing comprising a first end and a second end, said housing defining an exterior of said pyrotechnic gas generator;

a first inner wall of said housing defining a first diameter, said first inner wall proximate said first end;

a second inner wall of said housing defining a second diameter, said housing defining the second inner wall proximate said second end;

a third inner wall of said housing defining a third diameter, said third diameter smaller than either said first or second diameters and said third inner wall intermediate of said first inner wall and second inner wall;

a first ledge formed at a point where said first and said third inner walls meet; and a second ledge formed at a point where said second and said third inner walls meet wherein said first and second ledges function to weldlessly contact and retain inner components of said gas generator.

2. A gas generator for a vehicle occupant protection system comprising:

a housing comprising a first end and a second end;

a first inner wall of said housing defining a first diameter, said first inner wall proximate said first end;

a second inner wall of said housing defining the second diameter, said housing defining a second inner wall proximate said second end;

a third inner wall of said housing defining a third diameter, said third diameter smaller than either said first or second diameters and said third inner wall intermediate of said first inner wall and second inner wall;

a first ledge formed at a point where said first and said third inner walls meet;

a second ledge formed at a point where said second and said third inner walls meet wherein said first and second ledges function to retain inner components of said inflator;

an initiator assembly fixed within said first end, said initiator assembly defining a first outer diameter wherein the first outer diameter is substantially equivalent to said first inner diameter and said initiator assembly is press fit within said first inner wall to rest upon said first ledge;

a propellant bed formed within said third inner wall ignitable by said initiator assembly for generating gas;

a gas filter fixed within said second inner wall and resting upon said second ledge, said filter having a first metallic density; and an enhancer disc juxtaposed against said filter, said enhancer disc having a metallic density greater than said filter, whereby said enhancer disc modifies the gas flow rate upon inflator operation.

3. A pyrotechnic gas generator for a vehicle occupant protection system comprising:

a housing comprising a first end and a second end;

a first inner wall of said housing defining a first diameter, said first inner wall proximate said first end;

a second inner wall of said housing defining a second diameter, said housing defining the second inner wall proximate said second end;

a third inner wall of said housing defining a third diameter, said third diameter smaller than either said first or second diameters and said third inner wall intermediate of said first inner wall and second inner wall;

a first ledge formed at a point where said first and said third inner walls meet;

a second ledge formed at a point where said second and said third inner walls meet wherein said first and second ledges function to retain inner components of said gas generator;

an initiator assembly press fit within the first inner wall and resting against said first ledge;

a propellant bed contained within said third wall and ignitable by said initiator assembly for producing inflating gases; and a filter press fit within the second inner wall and resting against said second ledge.

4. The gas generator of claim 3 further comprising an enhancer disc coaxially aligned and juxtaposed against said filter, said disc intermediate of said filter and said second end, wherein said disc modifies or attenuates the gas flow rate upon gas generator operation.

* * * * *